(12) United States Patent
Liao et al.

(10) Patent No.: US 6,531,762 B1
(45) Date of Patent: Mar. 11, 2003

(54) SEMICONDUCTOR PACKAGE

(75) Inventors: Chih-Chin Liao, Yuan-Lin (TW); Kuan-Cheng Chen, Chia-Yi (TW)

(73) Assignee: Siliconware Precision Industries Co., Ltd., Taiwan (CN)

( * ) Notice: Subject to any disclaimer, the term of this patent is extended or adjusted under 35 U.S.C. 154(b) by 0 days.

(21) Appl. No.: 09/992,993

(22) Filed: Nov. 14, 2001

(51) Int. Cl.7 .................. H01L 23/495; H01L 23/48
(52) U.S. Cl. .............. 257/666; 257/668; 257/676; 257/737; 257/738; 257/781; 257/784
(58) Field of Search ................. 257/678, 666, 257/684, 782, 784, 685, 668, 673, 674, 676, 737, 738, 786, 787; 216/23; 438/106, 612, 617; 29/827; 361/777

(56) References Cited

U.S. PATENT DOCUMENTS

| | | | |
|---|---|---|---|
| 5,365,409 A | * 11/1994 | Kwon et al. ............ | 174/52.1 |
| 5,761,048 A | * 6/1998 | Trabucco ................ | 174/52.1 |
| 5,898,213 A | 4/1999 | Torres et al. ............ | 257/666 |
| 6,160,313 A | * 12/2000 | Takashima et al. ...... | 257/737 |

FOREIGN PATENT DOCUMENTS

JP 11-168150 * 6/1999

* cited by examiner

Primary Examiner—Minh Loan Tran
Assistant Examiner—Tan Tran
(74) Attorney, Agent, or Firm—Peter F. Corless; Steven M. Jensen; Edwards & Angell, LLP

(57) ABSTRACT

A semiconductor package is proposed, in which a substrate is formed with a chip bonding area and a plurality of bond fingers surrounding the chip bonding area, and a plurality of bridging elements are disposed in a stagger manner between the chip bonding area and the bond fingers on the substrate. Multiple wire bonding processes are performed to bond first gold wires between the chip and the bridging elements, and bond second gold wires between the bridging elements and the bond fingers. This therefore significantly shortens a wire bonding distance as compared with only one time of wire bonding for electrically connecting the chip to the substrate. As a result, wire bond operability is improved, and the shortened wire bonding distance reduces wire length so as to enhance resistance of the gold wires to mold flow impact during molding, thereby preventing wire sweeping or wire sagging from occurrence.

11 Claims, 9 Drawing Sheets

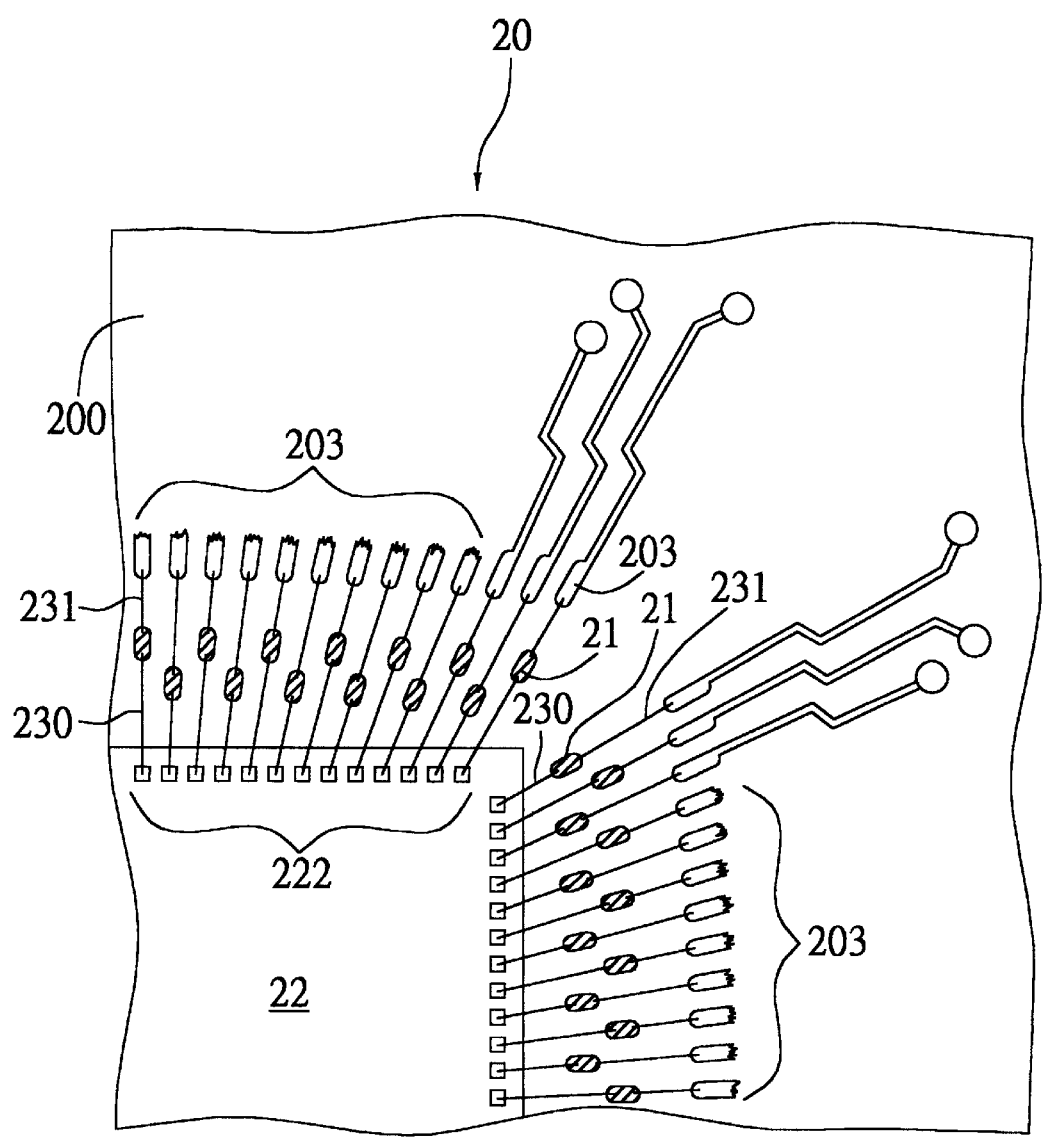

SEMICONDUCTOR PACKAGE

FIELD OF THE INVENTION

This invention relates to semiconductor packages, and more particularly, to a WBBGA (wire bond ball grid array) semiconductor package, in which a wire bonding distance is shortened.

BACKGROUND OF THE INVENTION

A BGA (ball grid array) semiconductor package becomes a mainstream product due to its incorporation with sufficient I/O connections in response to high density of electronic elements and electronic circuits. In accordance with increase in the number of the I/O connections, a substrate in the BGA semiconductor package needs to densely accommodate a plurality of bond fingers, for allowing a semiconductor chip to be wire bonded to the bond fingers and then electrically connected to an external circuit.

Generally, a BGA semiconductor package has bond fingers arranged therein in a manner shown in FIG. 1. First, a substrate 10 is prepared for mounting a semiconductor chip 12 thereon, with a plurality of bond pads 122 formed on the chip 12. Then, a plurality of bond fingers 103 are circularly disposed around the chip 12. Finally, a plurality of gold wires 13 are respectively connected to the corresponding bond pads 122 and bond fingers 103, so as to provide an electrically conductive path for the chip 12 to be connected to outside. The structure shown in drawing is exemplified in simplicity, however in practice, the arrangement of bond fingers can be more complicated in a semiconductor package.

However, due to limitation of a conventional etching technology, the bond fingers 103 on the substrate 10 are each dimensioned in width of 3 mils (one mil equals to a thousandth of an inch), and a shortest distance between two adjacent bond fingers 103 is about 3 mils; that is, a 6-mil wide area P is occupied by forming an additional bond finger 103. As shown in FIG. 1, in the provision of the bond fingers 103 circularly surrounding the chip 12, if the chip 12 is considered as a geometrical center of the circle, thus the bond fingers 103 each is spaced from the chip 12 by a shortest distance R of $6n/2\pi$, wherein n represents the number of the bond fingers 103, and 6n is a circumference of the circle formed by the bond fingers. Similarly, the bond pads 122 on the chip 12 each is spaced from the chip 12 by a shortest distance d, and thus a shortest wire-bonding distance (i.e. wire span, designated by a reference character s) between a bond finger 103 and a bond pad 122 theoretically equals to R-d. As the bond fingers 103 increase in number corresponding to more I/O connections (not shown) incorporated on the substrate 10, the circumference 6n formed by the bond fingers 103 accordingly expand. This therefore unavoidably increases the wire spans s between the bond fingers 103 and the bond pads 122 of the chip 12.

The increased wire span s elongates its wire length, and generally the wire length is about 1.2 times of the wire span. This is disadvantageous for performing a wire bonding process and a molding process, for example, wire sweeping or wire sagging easily occurs to cause short circuit due to impact from a mold flow of a molding compound during molding, as shown in FIG. 2 with dotted lines representing original positions of gold wires 13, which are dislocated due to the mold flow impact indicated by arrows. U.S. Pat. No. 6,031,281 utilizes a plurality of dummy wires to be positioned on a semiconductor chip at where mold flow impact is strongest, so as to enhance resistance of gold wires to the mold flow and reduce the occurrence of wire sweeping. However, the provision of the dummy wires significantly increases complexity and costs in fabrication.

In order to solve the foregoing problems relating to the wire bonding process, U.S. Pat. No. 5,898,213 discloses a method for arranging bond fingers with a shortened wire bonding distance. Compared with the conventional bond finger arrangement, the disclosed method eliminates the drawback of wire length elongating in response to increase in the number of bond fingers. As shown in FIG. 3, this method is characterized in that two sets of bond fingers 110', 111' form a circle around a semiconductor chip 12', and the adjacent bond fingers 110', 111' are arranged in a stagger manner, wherein the set of bond fingers positioned more distant from the chip 12' is referred to as a first set of bond fingers 10', and the set of bond fingers positioned less distant from the chip 12' is referred to as a second set of bond fingers 111'. Due to the staggered arrangement of the first bond fingers 110' and the second bond fingers 111', thus a shortest distance P2 between the adjacent bond fingers 110', 111' is halved to be 3 mils, and a shortest distance (not shown) from the bond fingers to the chip 12' is reduced to be $3n/2\pi$(i.e. ½R), which significantly shortens the wire bonding distance.

However, the foregoing method with the shortened wire bonding distance has the following drawbacks. In practical use, the staggered arrangement of the first bond fingers 110' and the second bond fingers 111' makes it difficult for accurately bonding gold wires to the corresponding bond fingers, that is, a bonder used for wire bonding can hardly recognize positions of the bond fingers, resulting in the gold wires not bonded to the bond fingers but to conductive traces connected to the bond fingers; this therefore degrades the wire bonding quality.

SUMMARY OF THE INVENTION

A primary objective of the present invention is to provide a semiconductor package, in which a plurality of bridging elements are formed between a chip bonding area and bond fingers on a substrate, so as to shorten a wire bonding distance and improve wire bonding operability.

Another objective of the present invention is to provide a semiconductor package, in which resistance to impact of a mold flow is enhanced for gold wires, so as to prevent wire sweeping from occurrence.

A further objective of the present invention is to provide a semiconductor package, in which an existing fabrication technology is employed for disposing a plurality of bridging elements in a stagger manner on a substrate, and this is therefore cost-effective to implement.

In accordance with the above and other objectives, the present invention proposes a semiconductor package, comprising: a substrate having a chip bonding area, and a plurality of bond fingers disposed around the chip bonding area; a plurality of bridging elements disposed in a stagger manner between the chip bonding area and the conductive portions on the substrate, for use with multiple times of wire bonding; at least one semiconductor chip mounted on the chip bonding area, and having an active side formed with a plurality of bond pads thereon; a first set and a second set of gold wires for electrically connecting the bond pads of the semiconductor chip to the bridging elements, and the bridging elements to the bond fingers, respectively; and an encapsulant for encapsulating the semiconductor chip, the gold wires and the bridging elements.

The provision of the bridging elements is mainly to electrically interconnect the first gold wires and the second gold wires, so as to successfully perform multiple wire bonding processes. This allows electronic signals outputted from the semiconductor chip to be transmitted from the bond pads, the first gold wires, the bridging elements, the second gold wires and the bond fingers to an external circuit.

Compared with a conventional package structure experiencing only one wire bonding process, the semiconductor package of the invention carried out with multiple times of wire bonding significantly shortens a wire bonding distance in each wire bonding process, so that wire span and loop height are reduced, and wire bonding operability is improved. This therefore enhances resistance of the gold wires to mold flow impact in a molding process, so as to prevent wire sweeping or wire sagging from occurrence.

BRIEF DESCRIPTION OF THE DRAWINGS

The invention can be more fully understood by reading the following detailed description of the preferred embodiments, with reference made to the accompanying drawings, wherein:

FIG. 5C is a top view of a semiconductor package of the invention after completing multiple times of wire bonding;

DETAILED DESCRIPTION OF THE PREFERRED EMBODIMENT

The following description is made with reference to FIGS. 4–7 for depicting preferred embodiments of a semiconductor package of the present invention, and the drawings are exemplified in simplicity for only illustrating associated elements relating to the invention. Since bridging elements in the semiconductor package of the invention are formed and arranged on a substrate in a stagger manner for use with multiple times of wire bonding, the invention is in exemplification of a WBBGA (wire bond ball grid array) semiconductor package herein.

First Preferred Embodiment

Figure 1:
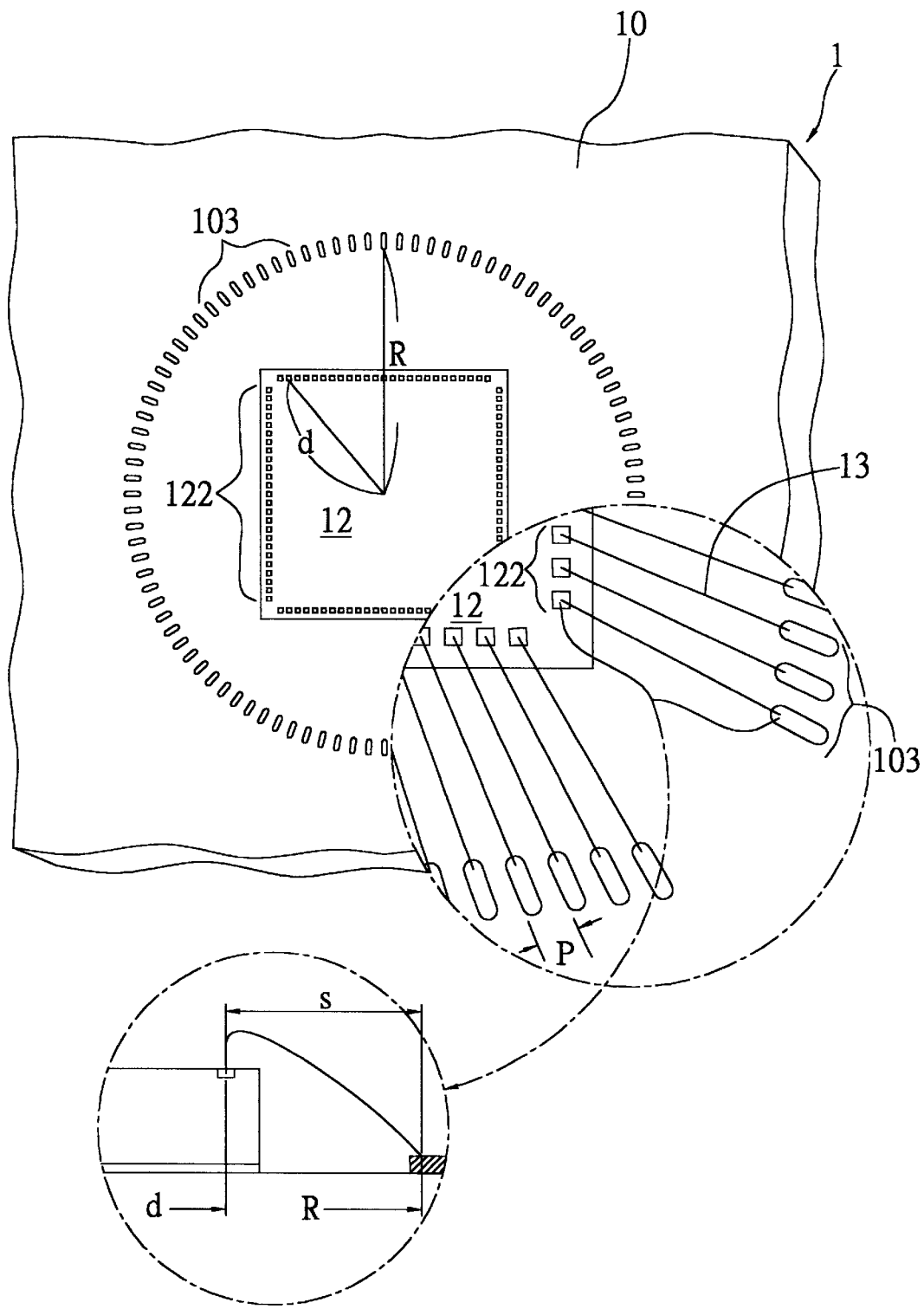
FIG. 1 (PRIOR ART) is a partial top view of a conventional BGA semiconductor package.
Figure 2:
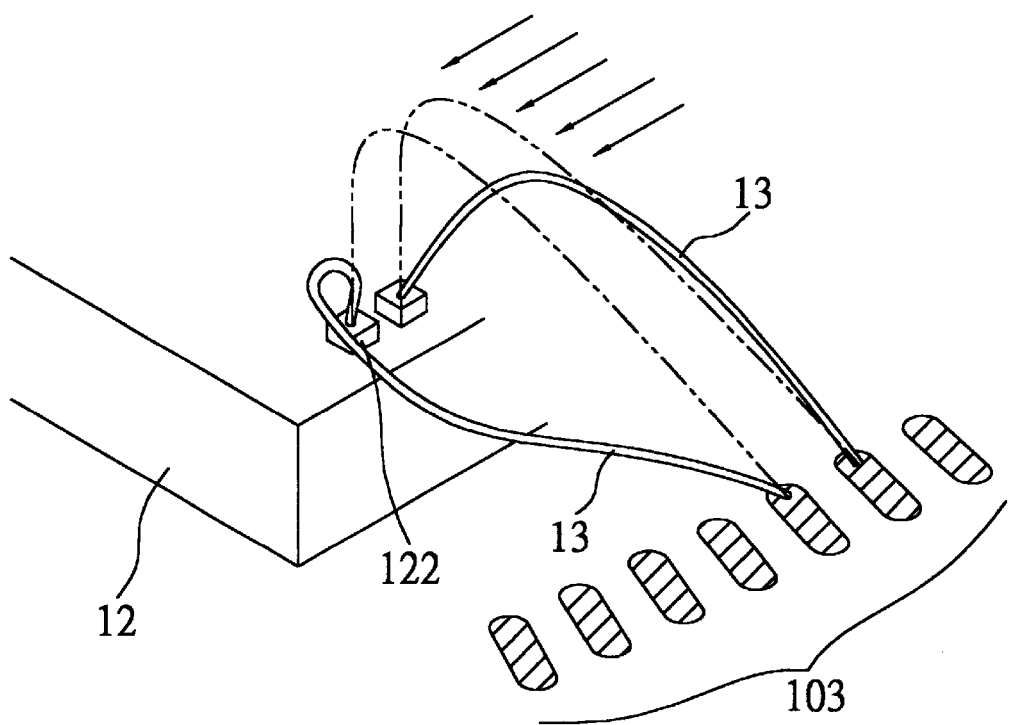
FIG. 2 (PRIOR ART) is a perspective view of a semiconductor package in FIG. 1 under an effect of a mold flow.
Figure 3:
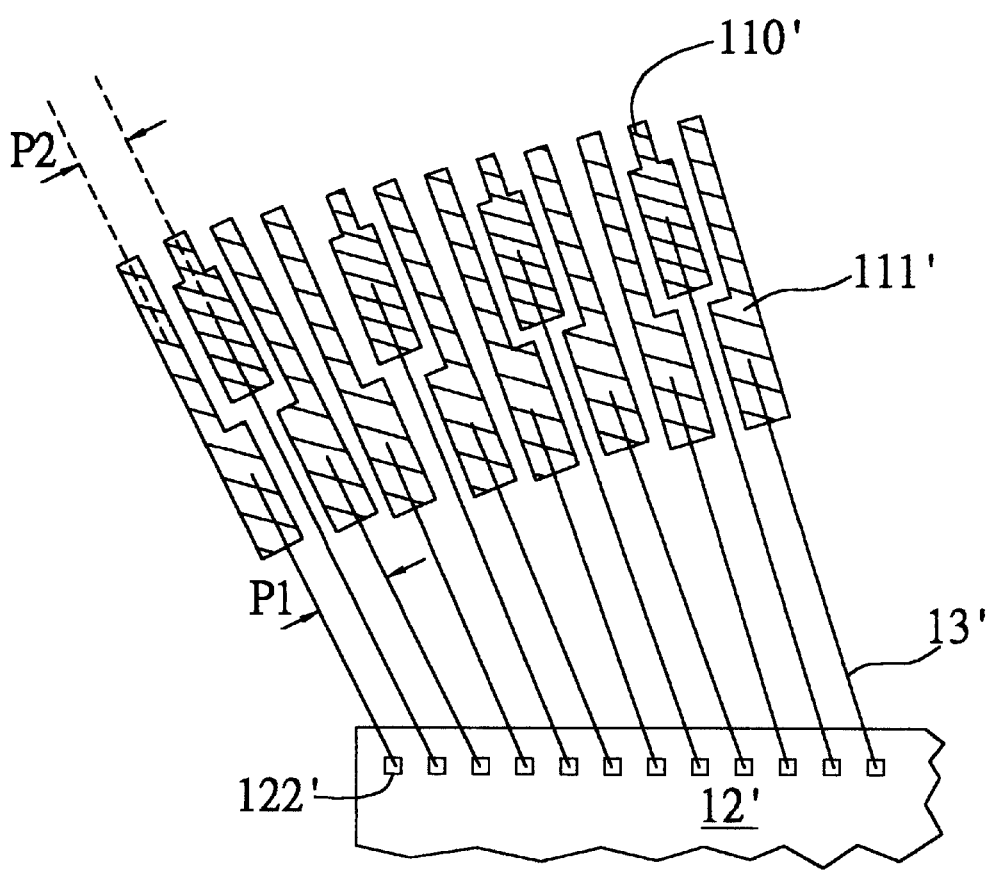
FIG. 3 (PRIOR ART) is a top view of a semiconductor package disclosed in U.S. Pat. No. 5,898,213.
Figure 4:
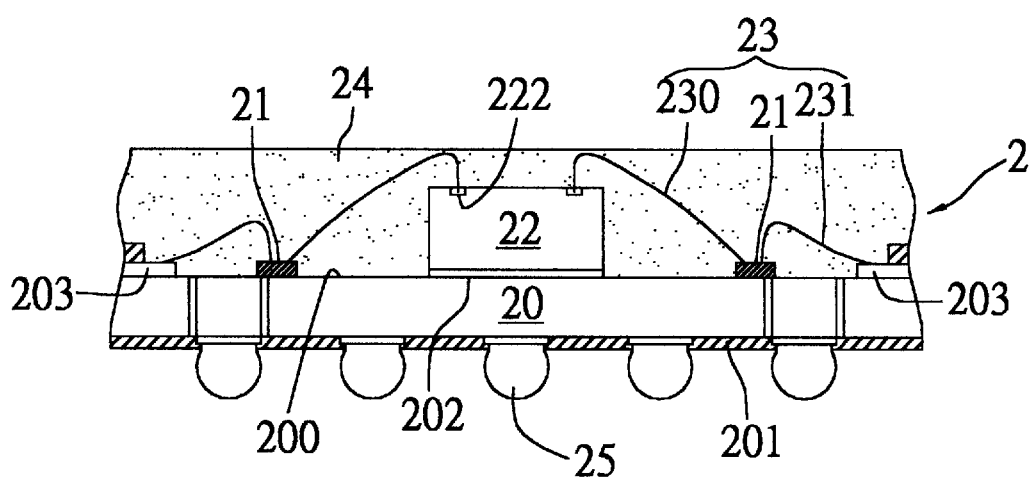
FIG. 4 is a sectional view of a semiconductor package of the invention.

As shown in FIG. 4, the semiconductor package 2 of the invention comprises a substrate 20, with a chip bonding area 202 defined thereon and a plurality of bond fingers 203 surrounding the chip bonding area 202; a plurality of bridging elements 21 disposed in a stagger manner between the chip bonding area 202 and the bond fingers 203 on the substrate 20, for use with multiple times of wire bonding; at least one semiconductor chip 22 attached to the chip bonding area 202; a plurality of gold wires 23 for providing electrical connection between the chip 22 and the bridging elements 21, and between the bridging elements 21 and the bond fingers 203; and an encapsulant 24 for encapsulating the chip 22, the gold wires 23 and the bridging elements 21.

Figure 5A:
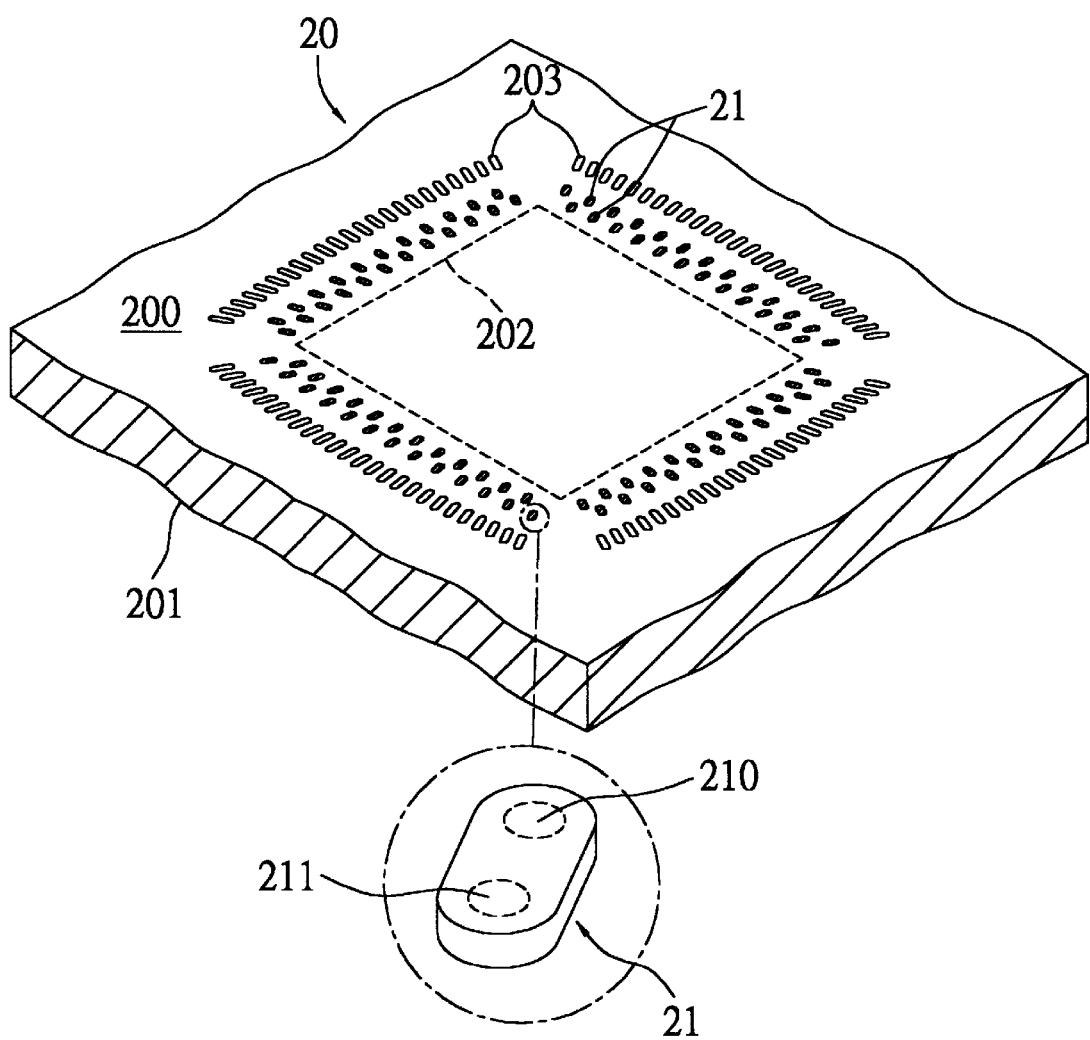
FIG. 5A is a top view of a substrate used in a semiconductor package of the invention.

FIG. 5A is a top view of a substrate used in a BGA semiconductor package of the invention. As shown in the drawing, the substrate 20 has a front side 200 and an opposing back side 201, wherein a chip bonding area 202 is pre-defined on the front side 200 of the substrate 20 for mounting a semiconductor chip (not shown) thereon, and a plurality of bond fingers 203 connected to conductive traces (not shown) are disposed around the chip bonding area 202. A plurality of bridging elements 21 are formed and arranged in a stagger manner between the chip bonding area 202 and the bond fingers 203 on the front side 200 of the substrate 20, for use in a wire bonding process. The bridging elements 21 are metal structure analogous to bond pads, and each consists of a first bonding portion 210 and a second bonding portion 211 to be bonded with different sets of gold wires (not shown). Further, in order to reinforce bondability between the bridging elements 21 and the gold wires, the bridging elements 21 are normally plated with nickel and gold (Ni/Au).

The staggered arrangement of the bridging elements 21 on the substrate 20 enlarges spacing between the adjacent bridging elements 21; this therefore eliminates the drawbacks in the prior art due to limitation of the etching technology, and allows the semiconductor package of the invention to be fabricated by using existing technology with.no concern of increase in costs.

Figure 5B:
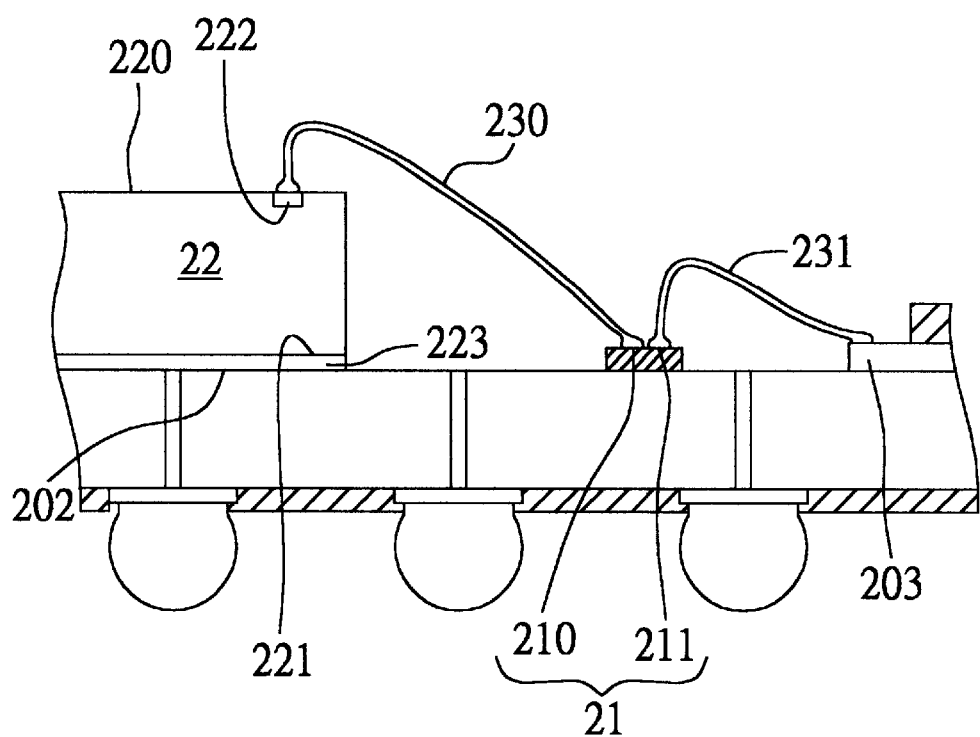
FIG. 5B is a partial sectional view of a semiconductor package of the invention after completing multiple times of wire bonding.

Referring to FIG. 5B (a partial sectional view) and FIG. 5C (a top view), at least one semiconductor chip 22 is used, having an active side 220 with a plurality of electronic circuits and electronic elements disposed thereon, and a non-active side 221, wherein a plurality of bond pads 222 are formed on the active side 220. The semiconductor chip 22 is attached to the chip bonding area 202 on the substrate 20 by means of an adhesive 223. Two wire bonding processes are performed: first, a first set of gold wires 230 are formed by using a conventional wire bonding technology to connect the bond pads 222 on the chip 22 to the first bonding portions 210 of the bridging elements 21, and then, a second wire bonding process is conducted to form a second set of gold wires 231 for connecting the second bonding portions 211 of the bridging elements 21 to the bond fingers 203. It should be noted that two times of wire bonding are exemplified in this embodiment of the invention, however in practice, three times or more can be proceeded depending on the arrangement of the bridging elements on the substrate. Finally, referring back to FIG. 4, an encapsulant 24 is formed to encapsulate the chip 22, the bridging elements 21, the first set of gold wires 230 and the second set of gold wires 231, so that the BGA semiconductor package 2 of the invention is completed.

In conclusion, the semiconductor package 2 of the invention is characterized in the provision of the plurality of the bridging elements 21 arranged in a stagger manner on the front side 200 of the substrate 20. The bridging elements 21 each has both the first bonding portion 210 and the second bonding portion 211, and act as relay contacts for electrically interconnecting the first gold wires 230 on the first bonding portions 210 and the second gold wires 231 on the second bonding portions 211. This allows electronic signals of the chip 22 to be.transmitted through the bond pads 222, the first gold wires 230, the bridging elements 21 and the second gold wires 231 to the bond fingers 203, so as to provide an electrically conductive path for the chip 22 to be connected to outside.

Figure 6:
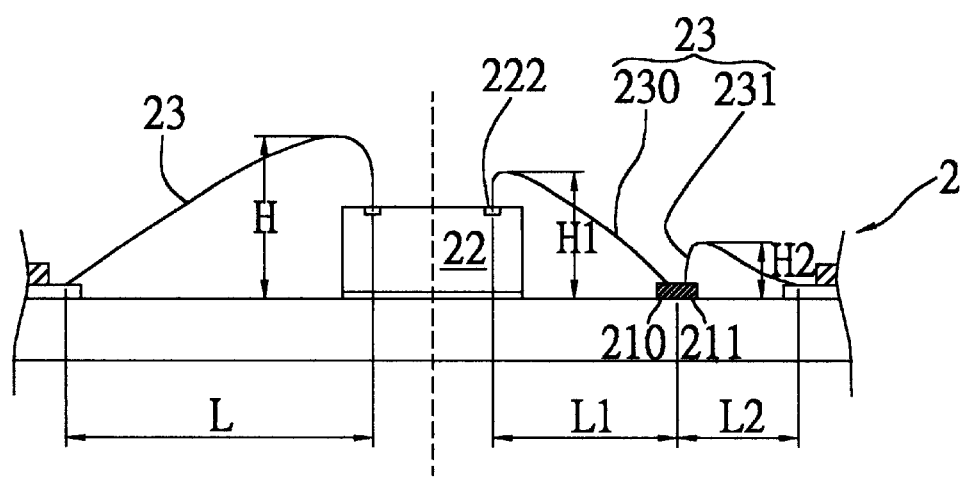
FIG. 6 is a comparative sectional view of a semiconductor package of the invention and a conventional semiconductor package.

Referring to FIG. 6, compared with a conventional package structure experiencing only one wire bonding process as shown in left half part of FIG. 6, the semiconductor package of the invention (shown in right half part of FIG. 6) employs multiple wire bonding processes, so as to significantly shorten wire span from L to L1 and L2, and reduce loop height from H to H1 and H2, thereby making difficulty in wire bonding decreased but process operability improved. Such reduction in wire length also enhances resistance of gold wires to impact from a mold flow in a molding process, and thus wire dislocation can be prevented from occurrence, allowing the wire bonding quality to be well maintained.

Second Preferred Embodiment

Figure 7:
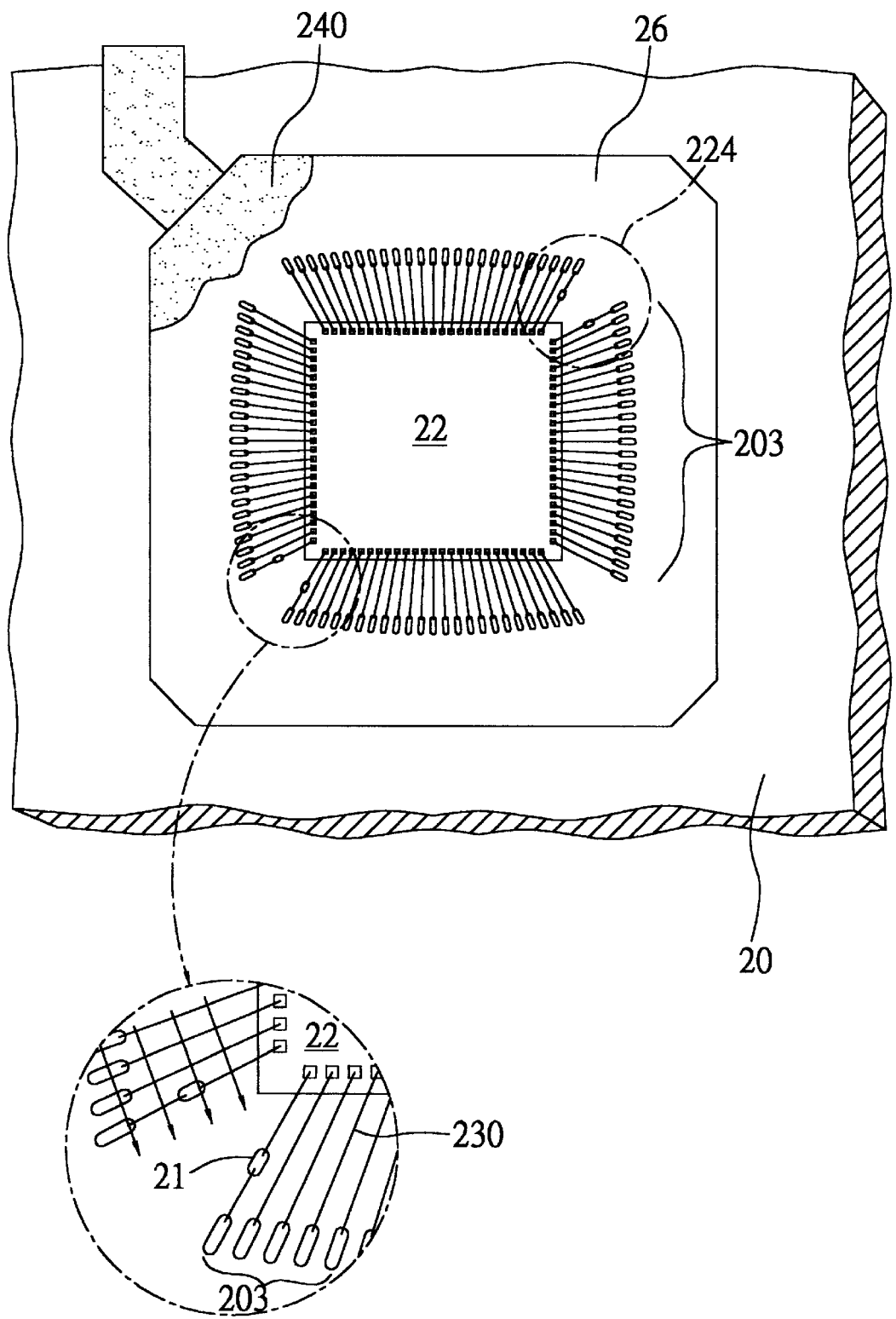
FIG. 7 is a perspective view of a semiconductor package of a second preferred embodiment of the invention in a molding process.

Illustrated in FIG. 7 is a second preferred embodiment of a semiconductor package of the invention. The semiconductor package of this embodiment is structurally identical to that of the foregoing first embodiment, with the only difference in that in the second embodiment, the bridging elements 21 are not uniformly distributed between the semiconductor chip 22 and the bond fingers 203 on the substrate 20, but they are positioned at where impact from the mold flow in the molding process is strongest. As shown in the drawing, after a molding compound 240 for forming an encapsulant (not shown) is injected into a molding cavity 26, diagonal corners 224 of the chip 22 vertical to a flow direction of the molding compound 240 suffers strongest flow impact from the molding compound 240, resulting in sweeping or sagging of gold wires 230. Therefore, a plurality of bridging elements 21 are formed at positions around the diagonal corners 224 so as to enhance resistance of the gold wires 230 to the flow impact from the molding compound 240. Such an arrangement of disposing the bridging elements 21 only at predetermined positions of the chip 22 reduces complexity in wire bonding, and also effectively saves costs in fabrication.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:

a substrate having a chip bonding area, and a plurality of conductive portions disposed around the chip bonding area and electrically connected to outside, wherein an inner intermediate area surrounding the chip bonding area and an outer intermediate area surrounding the inner intermediate area are formed between the chip bonding area and the conductive portions on the substrate such that the inner intermediate area is positioned between the chip bonding area and the outer intermediate area, wherein a set of inner bridging elements are disposed within the inner intermediate area, and a set of outer bridging elements are disposed within the outer intermediate area in a manner that the inner bridging elements are arranged in a staggered manner with respect to the outer bridging elements, so as to enlarge spacing between adjacent bridging elements to allow for easy positional recognition of the bridging elements;

at least one semiconductor chip mounted on the chip bonding area;

a plurality of first conductive elements for electrically connecting the semiconductor chip to the inner and outer bridging elements;

a plurality of second conductive elements for electrically connecting the inner and outer bridging elements to the conductive portions; and an encapsulant for encapsulating the semiconductor chip, the bridging elements, the first conductive elements and the second conductive elements.

2. The semiconductor package of claim 1, wherein the semiconductor package is a WBBGA (wire bond ball grid array) semiconductor package.

3. The semiconductor package of claim 1, wherein the conductive portions are bond fingers.

4. The semiconductor package of claim 1, wherein the bridging elements are disposed at positions around diagonal corners of the semiconductor chip.

5. The semiconductor package of claim 1, wherein the bridging elements are made of metal, and each has both a first bonding portion and a second bonding portion.

6. The semiconductor package of claim 5, wherein the semiconductor chip has an active side and an opposing non-active side, with a plurality of bond pads formed on the active side.

7. The semiconductor package of claim 6, wherein the first conductive elements electrically connect the bond pads of the semiconductor chip to the first bonding portions of the bridging elements.

8. The semiconductor package of claim 5, wherein the second conductive elements electrically connect the second bonding portions of the bridging elements to the conductive portions.

9. The semiconductor package of claim 1, wherein the bridging elements are plated with gold and nickel thereon.

10. The semiconductor package of claim 1, wherein the first conductive elements are gold wires.

11. The semiconductor package of claim 1, wherein the second conductive elements are gold wires.

* * * * *